US010128428B2

(12) United States Patent
Seeber

(10) Patent No.: US 10,128,428 B2
(45) Date of Patent: Nov. 13, 2018

(54) TERNARY MOLYBDENUM CHALCOGENIDE SUPERCONDUCTING WIRE AND MANUFACTURING THEREOF

(71) Applicant: scMETROLOGY SÀRL, Genève (CH)

(72) Inventor: Bernd Seeber, Genève (CH)

(73) Assignee: scMetrology Sàrl, Genève (CH)

( * ) Notice: Subject to any disclaimer, the term of this patent is extended or adjusted under 35 U.S.C. 154(b) by 0 days.

(21) Appl. No.: 15/117,579

(22) PCT Filed: Feb. 10, 2014

(86) PCT No.: PCT/CH2014/000017
§ 371 (c)(1),
(2) Date: Aug. 9, 2016

(87) PCT Pub. No.: WO2015/117249
PCT Pub. Date: Aug. 13, 2015

(65) Prior Publication Data
US 2016/0351781 A1    Dec. 1, 2016

(51) Int. Cl.
*H01L 39/24* (2006.01)
*H01B 12/02* (2006.01)
(Continued)

(52) U.S. Cl.
CPC ......... *H01L 39/2412* (2013.01); *H01B 12/02* (2013.01); *H01L 39/12* (2013.01); *B22F 3/15* (2013.01)

(58) Field of Classification Search
CPC .............................. H01L 39/2412; H01B 12/02
See application file for complete search history.

(56) References Cited

U.S. PATENT DOCUMENTS 4,594,218 A    6/1986 Dubots et al.
4,704,249 A    11/1987 Glatzle
(Continued)

FOREIGN PATENT DOCUMENTS

EP    0 171 918 A1    2/1986
EP    0 181 496 A1    5/1986

OTHER PUBLICATIONS

Yamasaki et al., High critical current densities reproducibly observed for hot-isostatic-pressed PbMo6S8 wires with Mo barriers, Article, Aug. 1992, pp. 1180-1182, 1992 American Institute of Physics.
(Continued)

*Primary Examiner* — Paul A Wartalowicz
(74) *Attorney, Agent, or Firm* — Davis & Bujold PLLC; Michael J. Bujold

(57) ABSTRACT

A process for the manufacturing of 100% dense TMC bulk material by hot isostatic pressing (HIP) for manufacturing of ternary molybdenum chalcogenide (TMC) single or multifilamentary superconducting wires, in particular that of $SnMo_6S_8$ (SMS) and $PbMo_6S_8$ (PMS). Such wires allows generation of magnetic fields in excess of 24 Tesla, the limit of the presently used $Nb_3Sn$ wires. In addition, TMC superconducting wires are complementary to $Nb_3Sn$ because they have about four times higher mechanical strength, i.e., yield strength $R_{p02}$. The deformation process by hot extrusion and the hot wire drawing allow plastic/superplastic deformation of the TMC superconductor with perfect grain boundaries, increase the critical current density. Further, the use of high purity molybdenum, with a residual resistivity ratio of at least 100, is considered as an additional inventive step because molybdenum serves not only as a diffusion barrier but simultaneously as electrical stabilizer.

13 Claims, 3 Drawing Sheets

(51) Int. Cl.
  *H01L 39/12* (2006.01)
  *B22F 3/15* (2006.01)

(56) References Cited

U.S. PATENT DOCUMENTS

| | | | | |
|---|---|---|---|---|
| 2002/0198111 A1* | 12/2002 | Tomsic | ............... | H01L 39/2487 505/230 |
| 2005/0178472 A1* | 8/2005 | Hong | ................... | B21C 37/047 148/98 |
| 2006/0165579 A1* | 7/2006 | Jones | ...................... | C01B 35/04 423/289 |
| 2007/0004579 A1* | 1/2007 | Bookbinder | .............. | C03C 3/06 501/54 |
| 2010/0087324 A1* | 4/2010 | Fluekiger | ................ | H01L 39/24 505/431 |

OTHER PUBLICATIONS

Seeber, Processing of low Tc conductors: the compounds PbMo6S8 and SnMo6S8, Handbook of Superconducting Materials, vol. I: Superconductivity, Materials and Processes, pp. 685-706, Institute of Physics Publishing Bristol and Philadelphia.

Tinkham, Introduction to Superconductivity, The BCS Theory, Book, pp. 16-19, McGraw-Hill Book Company.

Tinkham, Introduction to Superconductivity, Nucleation in Bulk Samples: Hc2, Book, pp. 128-129, McGraw-Hill Book Company.

Yamasaki et al., Poor intergrain connectivity of PbMo6S8 in sintered Mo-sheathed wires and the beneficial effort of hot-isostatic-pressing treatments on the transport critical current density, Aug. 1991, Article, pp. 1606-1613, American Institue of Physics.

Rabiller et al., Niobium antidiffusion barrier reactivity in tin-doped, in situ PbMo6S8-based wires, Copyright 1992, Journal, pp. 447-453, Journal of Alloys and Compounds.

Seeber, Chevrel phases, Handbook of Applied Superconductivity, Copyright 1998, pp. 429-445, Institute of Physics Publishing Bristol and Philadelphia.

D.A. Cardwell et al, "Handbook of Superconducting Materials", Institute of Physics Publishing, 2003, Table 3.3.5.1., p. 695.

D.A. Cardwell et al, "Handbook of Superconducting Materials", Institute of Physics Publishing, 2003, Figure B 3.3.5.10., p. 696.

M. Tinkham, "Introduction to Superconductivity", McGraw Hill, 1975, p. 17.

M. Tinkham, "Introduction to Superconductivity", McGraw Hill, 1975, p. 129.

H. Hamasaki et al., Journal of Applied Physics, 70 (3), Aug. 1, 1991, Table I, p. 1607.

P Rabiller et al., Alloys Comp. 178 (1992), p. 447.

B. Seeber, "Handbook of Applied Superconductivity", B. Seeber, Institute of Physics Publishing, 1998, Figure B9.1.10 p. 442.

Yamasaki H. et al., "High Critical Current Densities Reproducibly Observed for Hot-Isostatic-Pressed PbMo6S8 Wires with Mo Barriers", Journal of Applied Physics, vol. 72, No. 3, Aug. 1, 1992, pp. 1180-1182 (International Search Report).

International Search Report Corresponding to PCT/CH2014/000017 dated Oct. 22, 2014.

* cited by examiner

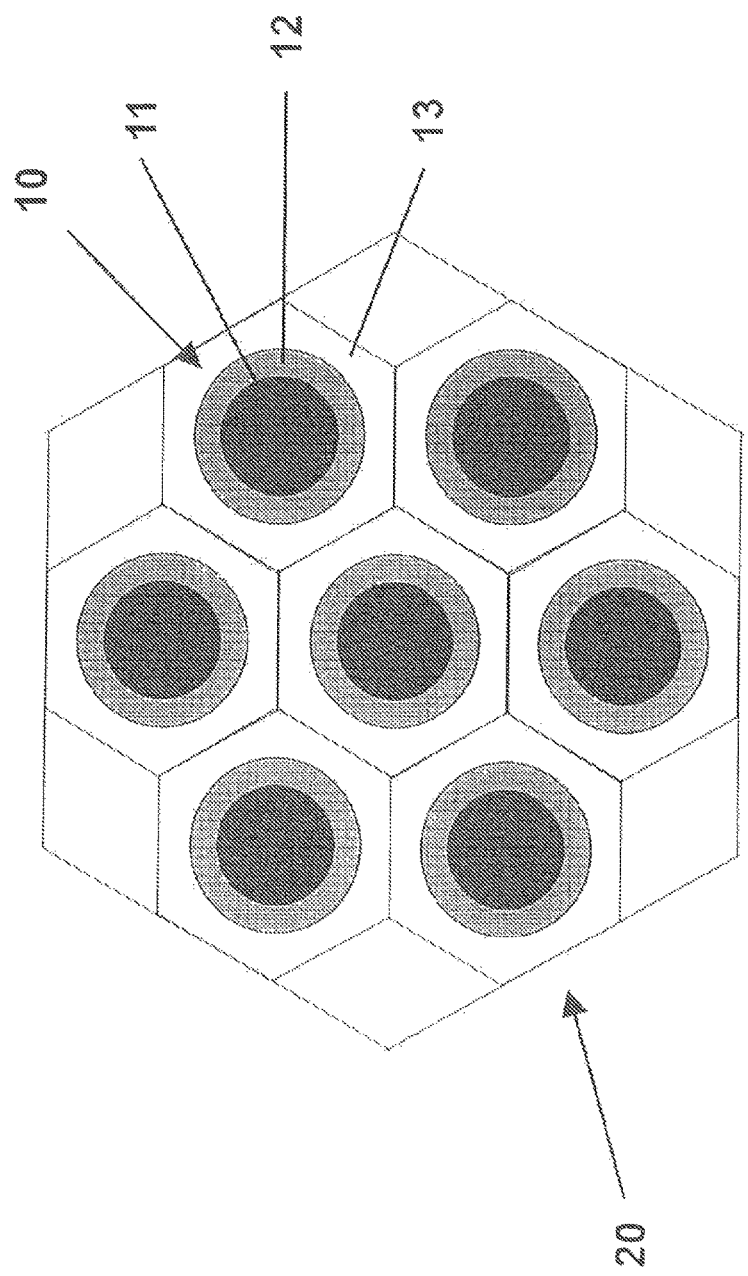

TERNARY MOLYBDENUM CHALCOGENIDE SUPERCONDUCTING WIRE AND MANUFACTURING THEREOF

TECHNICAL FIELD

The present invention concerns a process for manufacturing a ternary molybdenum chalcogenide (TMC) superconducting wire, especially $SnMo_6S_3$ and $PbMo_6S_8$ or a mixture of them, in which the engineering critical current densities are uniform over the length and at least 100 A/mm² at magnetic fields above 22 Tesla.

The present invention concerns further a ternary molybdenum chalcogenide (TMC) superconducting wire, especially $SnMo_6S_8$ and $PbMo_6S_8$ or a mixture of them, in which the engineering critical current densities are uniform over the length and at least 100 A/mm² at magnetic fields above 22 Tesla and manufactured according to the above process.

BACKGROUND ART

Today's commercial high field superconductors may be classified into two groups: NbTi (niobium-titanium) and $Nb_3Sn$ (niobium-tin). High temperature superconductors, discovered end 1986, can be manufactured on industrial scale but applications are limited due to short conductor lengths (ReBCO), insufficient mechanical strength (BCCO) and prohibitive high prices attaining 200 to 300 times that of NbTi.

Superconductivity is a physical phenomenon of many materials manifested by their loss of electrical resistance by cooling below the critical temperature. This temperature is material specific, e.g. for NbTi and $Nb_3Sn$ between 9 and 18 Kelvin (minus 264° C. and minus 255° C.), respectively. In comparison to conventional electrical conductors like copper, superconductors can carry without any losses much higher current, e.g. electrical power, typically 100 to 200 times more. Mainly for this reason they are used for the construction of high field magnets. Superconducting magnets are imperative for medical Magnetic Resonance Imaging (MRI) and Magnetic Resonance Spectroscopy (MRS) representing an important annual market.

Magnets need several km's of conductive wire, which is wound on a support structure. A magnetic field may be generated by putting an electrical current through the windings. In the case of a superconductor the current carrying capacity is limited by the critical current, which depends on magnetic field, temperature and mechanical stress. For the manufacturing of magnets the superconductor has to fulfill mayor requirements:

Availability in lengths of several km.

Winding of magnets without degradation of superconducting properties.

If possible, no heat treatment after magnet winding.

High mechanical strength for supporting high electromagnetic forces.

Engineering critical current density not less than 100 A/mm² at the nominal magnetic field (temperature).

Cost efficient conductor manufacturing.

NbTi superconductors are so far the perfect material. However, the achievable magnetic field strength is limited to about 11 Tesla. For higher magnetic fields, up to about 24 Tesla, $Nb_3Sn$ superconductors are available. $Nb_3Sn$ is brittle and cannot be manufactured like NbTi. The today's fabrication technologies use the assembling of the constituent materials, which can be manufactured to a conductor by extrusion and wire drawing. Because of this complication $Nb_3Sn$ superconductors are more expensive, about 6 to 10 times that of NbTi. The superconducting $Nb_3Sn$ phase is formed after magnet winding by an appropriate reaction heat treatment in the range of 650° C. during about 100 hours. Obviously any heat treatment of the magnet increases cost.

Many attempts for the manufacturing of ternary chalcogenide of molybdenum (TMC) superconducting wires were carried out worldwide. For example, in U.S. Pat. No. 4,594,218 a superconducting wire of ternary chalcogenide of molybdenum is obtained by mixing a powder of ternary chalcogenide of molybdenum with a metal powder of smaller granularity and inserted in a metallic tube (e.g. molybdenum, niobium, tantalum, titanium and vanadium). The aim of an additional metallic powder is for removing voids and their elimination by sintering at high temperatures. After drawing and cold working the wire is subject to a final heat treatment at about 800° C. for at least twenty hours.

Further, in European patent specification EP 0 181 496 the initial superconducting material is a powdered superconducting phase, respectively the initial components for forming the phase, of an average grain size of less than 1 micrometer, which are inserted in a molybdenum tube and an outer steel jacket. Then the whole assembly is extruded at a temperature between 1000° C. and 1600° C. followed by wire drawing at elevated temperatures. It is emphasized that in European patent specification EP 0 181 496 the initial TMC material is powdered superconducting phase or respectively powdered initial components.

Another example, mentioned in the European patent application EP 0 171 918, uses TMC powder, or alternatively powder of its constituents, which is filled preferentially into a tantalum tube. The assembly is then processed into a wire and heat treated under pressure above 800° C.

Of particular relevance is the work of H. Yamasaki et al, (J. Appl. Phys. 72 (3), 1 Aug. 1992, page 1181, left-hand column, FIG. 1) who applied Hot Isostatic Pressing (HIP) after the manufacturing of a monofilamentary TMC wire with a molybdenum diffusion barrier and a stainless steel matrix. By this means the critical current density can be improved by a better connectivity of grains, as well as its uniformity of four wire samples with a length of 27 cm each (paragraph bridging page 1181 and 1182, FIG. 4). However, it is obvious to the person skilled in the art taking these data and calculate the upper critical field by a so-called Kramer extrapolation where $B^{0.25} J_c^{0.5}$ is a linear function of the magnetic field (B is the magnetic field in Tesla and $J_c$ is the critical current density in A/mm²). Extrapolating $J_c$ to zero gives the upper critical field, which is 33.5 T at 4.2 K in the mentioned work of H. Yamasaki et al. This value is below of its bulk value of 51 T, indicating that the TMC wires after HIP treatment still behave granular (see also B. Seeber in *Handbook of Superconducting Materials*, D. A. Cardwell and D. S. Ginley (eds), Institute of Physics Publishing, 2003, Figure B3.3.5.2., p. 687). For this reason a TMC wire manufactured according to the process of the present invention can be well distinguished from the process mentioned by H. Yamasaki et al.

Other methods for the fabrication of TMC wires are mentioned in scientific literature, which is reviewed by B. Seeber in *Handbook of Superconducting Materials*, D. A. Cardwell and D. S. Ginley (eds), Institute of Physics Publishing, 2003, Table 3.3.5.1. p. 695. Common to all work so far, patents and publications, is that the critical current densities are insufficient for practical applications. Depending of the kind of magnet, for cost reasons magnet builder need a minimum engineering critical current density of 100

A/mm² at the nominal field. Under engineering current density one understands the critical current divided by the total conductor cross section including non-superconducting matrix and stabilizer materials, as well as electric insulation. Comparing the most advanced TMC wire manufacturing techniques there is a convergence to about 80 A/mm² at 25 Tesla (see B. Seeker in Handbook of Superconducting Materials, D. A. Cardwell and D. S. Ginley (eds), Institute of Physics Publishing, 2003, Figure B3.3.5.10. p. 696).

Three main reasons for the insufficient engineering current density are identified:

Poor intergrain connectivity due to the powder metallurgical manufacturing process of the conductor.

Granular behavior of the TMC superconductor. This means that the superconducting properties, in particular the critical current, are reduced at grain boundaries with respect to that inside grains.

Barrier materials other than molybdenum, e.g. tantalum or niobium, are unsuited because granular behavior is favored due to the diffusion of sulphur along grain boundaries at higher temperatures.

For the understanding of granular behavior, a brief discussion of the coherence length of superconductors is helpful. Common to all high field superconductors is the short coherence length. This length, which is a characteristic of the material, indicates the distance over which electrons forming a Cooper pair are correlated (M. Tinkham, *Introduction to Superconductivity*, McGraw Hill, 1975, p. 17). Cooper pairs may be considered as charge carriers in a superconductor. The coherence length can be calculated by the Ginzburg Landau relation (M. Tinkham, *Introduction to Superconductivity*, McGraw Hill, 1975, p. 129).

$$B_{c2}(T) = \frac{\phi_0}{2\pi\xi(T)^2}$$

Where $B_{c2}$ is the material specific upper critical field, $\Phi_0$ is a physical constant (magnetic flux quantum) and $\xi$ is the coherence length. Note that $B_{c2}$, as well as $\xi$, depend on temperature. Once a magnetic field is exceeding $B_{c2}$ superconductivity breaks down. In other words, the higher the required magnetic field strength, the higher must be $B_{c2}$. Therefore, according the above mentioned relation, for increasing upper critical field the coherence length decreases.

The shorter the coherence length the local superconducting properties get sensitive to defects which have dimensions in the order of the coherence length or above. For instance grain boundaries may reduce locally the critical temperature, and also the upper critical field, and therefore the performance of the superconductor, i.e. the critical current. It is said that the superconductor behaves granular: with respect to the superconducting properties inside grains (intragrain properties) they are reduced at the grain boundary (intergrain properties).

NbTi and Nb₃Sn with a coherence length of 6.1 nm and 4.0 nm, respectively, show almost no granular behavior. However this may happen in TMC superconductors (3.3 nm to 2.6 nm). In particular the critical current is limited by the intergranular properties. As an example the study of H. Yamasaki shows that in the case of the PbMo₆S₈—TMC superconductor small quantities of lead precipitations at grain boundaries reduce the critical current by one order of magnitude (H. Yamasaki et al., J. Appl. Phys. 70 (3), 1 Aug. 1991, Table I, page 1607). Further, the grain boundary physical properties are degraded in a TMC superconductor with niobium barrier by diffusion of sulphur along grain boundaries. The situation was studied in detail by P. Rabiller et al., J. Alloys Comp, 178 (1992), p. 447. One result of the study was that the chemical interaction between the TMC core and the niobium is less pronounced by reducing the recovery/reaction heat treatment temperature and by increasing the density (less porosity). A similar situation is expected in the case of a tantalum barrier.

DISCLOSURE OF INVENTION

One of the objectives of the present invention is to overcome the limitations of Nb₃Sn conductors at a magnetic field of about 24 Tesla. From technological point of view the most interesting TMC superconductors are SnMo₅S₈ (SMS) and PbMo₆S₃ (PMS). The main advantage of these materials is that the upper limit of the achievable magnetic field lies between 30 Tesla (SMS) and 50 Tesla (MS), In addition, with respect to Nb₃Sn, the yield strength ($R_{p02}$) of a TMC superconductor is improved by a factor of four (see B. Seeber in Handbook of *Applied Superconductivity*, B. Seeber (ed), Institute of Physics Publishing, 1998, Figure B9.1.10. p. 442). Mainly for this reason TMC superconductors are also of interest in the magnetic field range where Nb₃Sn is used (11 Tesla to 24 Tesla). The mechanical strength is particularly important for large in size magnet systems like medical Magnetic Resonance Imaging (MRI), magnets for High Energy Physics (HEP) or thermonuclear fusion reactors representing a possible future source of sustainable energy.

With respect to Nb₃Sn, an additional advantage of the invention is that the TMC superconductor can be used for the construction of high field magnets without heat treatment after winding.

The problem of poor intergrain connectivity and granular behavior is solved in this invention by the application of hot plastic/superplastic deformation of 100% dense TMC bulk material. Consequently the engineering critical current density is no longer limited by grain connectivity and granularity. As a barrier material molybdenum is used mainly for its inertness with respect to the TMC superconductor and therefore preventing intergrain diffusion, which might degrade grain boundaries. Integral part of the invention is the use of high purity molybdenum with a residual resistivity ratio (RRR) of at least 100. Then the molybdenum barrier can also take over the function of a stabilizer like copper in the case of NbTi and Nb₃Sn.

The process according to the present invention is characterized in that the said superconducting wire is produced by powder metallurgy and by hot isostatic pressing (HIP) to be 100% dense bulk material loaded vacuum tight into a high purity molybdenum can and then vacuum tight into a stainless steel can suited for applications at the temperature of liquid helium and followed by hot extrusion between 1200° C. and the limit given by the stainless steel and hot wire drawing between 500° C. and 1200° C. allowing a plastic/superplastic deformation of the TMC filaments.

Advantageously, hot extrusion may be performed between a temperature of 1200° C. and the temperature limit given by the stainless steel.

According to a preferred manner to perform the process of the invention, hot wire drawing is performed between a temperature of 500° C. and 1200° C. allowing a plastic/superplastic deformation of the TMC filaments.

Hot isostatic pressing is preferably introduced before hot extrusion.

Preferably, an additional diffusion barrier like tantalum or niobium is introduced between the stainless steel jacket and the molybdenum barrier in order to maintain the residual resistivity ratio of the molybdenum during the hot extrusion and hot wire drawing process.

According to an advantageous embodiment, in a first step a monofilamentary or multifilamentary superconducting basic conductor, which is hot deformed to a round or a hexagonal cross section is manufactured, cut into straight pieces and in a second step, it is restacked vacuum tight into a second stainless steel extrusion billet and submitted to a hot deformation.

Advantageously, in a third step the multifilamentary superconductor manufactured after second hot extrusion and hot wire drawing is cut into straight pieces, restacked vacuum tight into a third stainless steel extrusion billet and hot deformed to produce a superconductor wire.

The TMC, which is preferably initially used is a bulk material other than $SnMo_6S_3$ and $PbMo_6S_8$ or a mixture of them.

The TMC initially may be used is bulk material with additives improving the superconducting properties in particular the engineering critical current density or the hot deformation process.

Advantageously, a molybdenum barrier is used with additives for improving the hot deformation process but without degrading the residual resistivity ratio (RRR).

The ternary molybdenum chalcogenide (TMC) superconductor element is characterized in that said superconductor element comprises at least one basic element having an internal TMC filament surrounded by a molybdenum barrier both elements being surrounded by a stainless steel jacket.

Said superconductor element comprises advantageously a number of TMC monofilament superconductors having each an internal TMC filament surrounded by a molybdenum barrier and a stainless steel jacket.

Preferably, each of said monofilament or multifilament superconductors is surrounded by a hexagonal or round cross section shaped stainless steel jacket.

BRIEF DESCRIPTION OF DRAWINGS

The invention will now be described, by way of examples, with reference to the accompanying drawings, in which:

FIG. 3 illustrates a schematic layout of a seven filament TMC superconductor.

MODE FOR CARRYING OUT THE INVENTION

Figure 1:
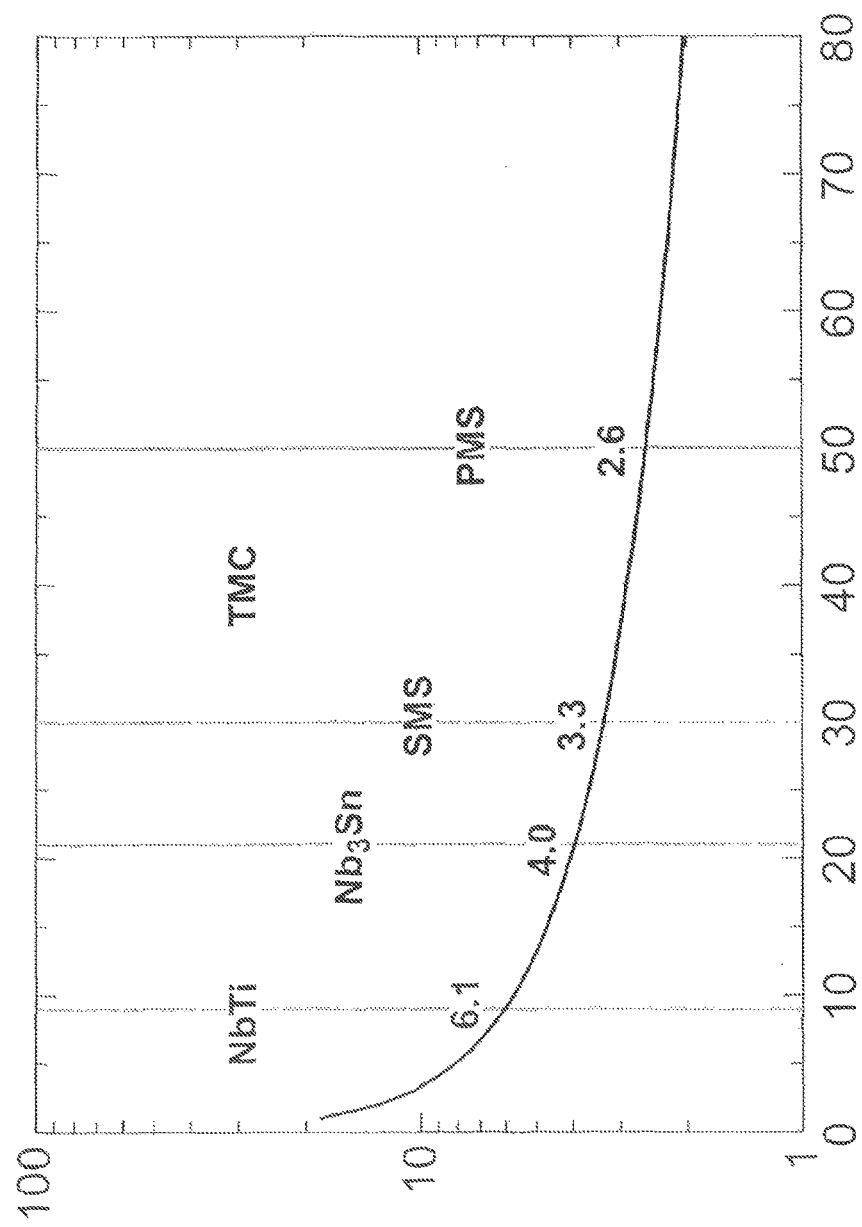
FIG. 1 represents the coherence length as a function of the upper critical field $B_{c2}$ at a temperature of 4.2 Kelvin.

FIG. 1 represents the coherence length as a function of the upper critical field $B_{c2}$ at a temperature of 4.2 Kelvin for NbTi, $Nb_3Sn$ and TMC superconductors. SMS and PMS stand for $SnMo_6S_8$ and $PbMo_6S_8$, respectively. Due to the relatively short coherence length of TMC superconductors they are particular sensitive to the quality of grain boundaries. Mainly for this reason wire manufacturing requires hot deformation techniques.

Because the thermal expansion of molybdenum is small, the TMC core/filament becomes under tensile stress by cooling from the manufacturing temperature to room temperature and to the temperature of liquid helium (minus 269° C.=4.2 Kelvin) required for the cooling (Miraglia et al., Mat. Res, Bull. 22 (1987), p. 795, and B, Seeber et al., IEEE Trans. Mag. 23 (1987), p. 1740). For this reason the TMC/molybdenum assembly is jacketed by stainless steel, which has a high thermal expansion. Taking a specific molybdenum/stainless steel ratio the thermal precompression of TMC filament at 4.2 Kelvin can be adjusted.

Figure 2:
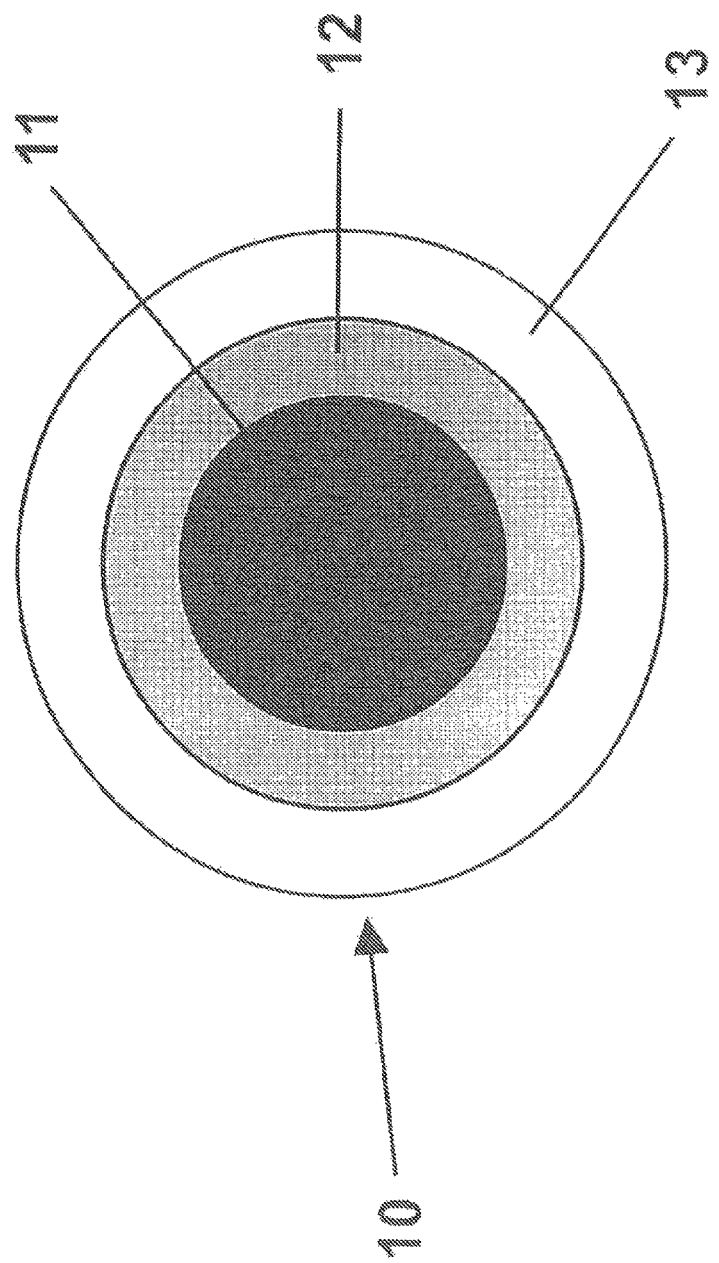
FIG. 2 illustrates a schematic layout of a basic monofilamentary TMC superconductor.

A schematic layout of the basic element 10 for a multifilamentary TMC conductor is shown in FIG. 2. The assembly is then extruded at about 1200° C. limited by the stainless steel jacket followed by hot wire drawing between 500° C. and 1200° C. The deformation process at elevated temperature is essential for plastic/superplastic deformation of the TMC superconductor. The basic element 10 comprises an internal TMC filament 11 surrounded by a molybdenum barrier 12, both elements being surrounded by a stainless steel jacket 13. The molybdenum barrier has a residual resistivity ration greater than 100 and serves as stabilizer and as diffusion barrier. The stainless steel jacket is required for adjusting the thermally induced stress to the TMC filament upon cooling. The whole assembly presents the basic element of a multifilementary TMC-superconductor.

The present invention is further described by following examples:

Example 1

In a first step the TMC bulk material is synthesized by powder metallurgical methods. The essential step is that this material is compressed to 100% density by preferentially hot isostatic pressing (HIP). The application of powder metallurgy allows a precise adjustment of the grain size and the grain size distribution, which is important for the subsequent hot deformation process. In addition, it is easy introducing additives for improving the engineering critical current density (pinning centers).

After machining of the 100% dense TMC bulk material into the shape of a cylinder it is inserted into a high purity molybdenum can which is then sealed under vacuum preferentially by electron beam welding. Because the molybdenum can serve as an electrical stabilizer it must have a residual resistivity ratio (RRR) of at least 100. In addition the molybdenum can has the function of as a diffusion barrier. Then the obtained assembly is inserted into a stainless steel can, which is sealed under vacuum preferentially by electron beam welding.

In a second step the billet of TMC, molybdenum, and stainless steel is extruded at high temperature, typically around 1200° C., followed by hot wire drawing. It is essential that the whole deformation process is carried out at elevated temperature. This allows a perfect intergrain connectivity avoiding granular behavior of the TMC superconductor. Following steps are deformation of the single core TMC wire/rod to required dimensions with a round or hexagonal cross section, cutting, straightening and restacking into a second stainless steel extrusion billet.

The principle is illustrated in FIG. 3 showing a seven filament TMC superconductor 20 comprising seven TMC monofilament superconductors 10 having a hexagonal cross section and with an internal TMC filament 11 surrounded by a molybdenum barrier 12, both elements being surrounded by a stainless steel jacket 13. TMC basis elements with a hexagonal cross section have an improved filling factor but the cross section may be changed for other reasons. The deformation process including extrusion and wire drawing at elevated temperature is repeated. Depending of the TMC superconductor layout eventually a third extrusion billet has to be assembled and deformed.

Example 2

The manufacturing process is described as in example 1.

In an additional step the billet (TMC+molybdenum+stainless steel) is subject of hot isostatic pressing (HIP) before extrusion, which assures perfect bonding between the different constituents. Extrusion and wire drawing is as described in example 1.

Example 3

In a first step the TMC bulk material is synthesized by powder metallurgical methods. The essential step is that this material is compressed to 100% density by preferentially hot isostatic pressing (HIP). The application of powder metallurgy allows a precise adjustment of the grain size and the grain size distribution, which is important for the subsequent hot deformation process. In addition, it is easy introducing additives for improving the engineering critical current density (pinning centers). After machining of the 100% dense TMC bulk material into the shape of a cylinder it is inserted into a high purity molybdenum can which is then sealed under vacuum preferentially by electron beam welding. Because the molybdenum can serves as an electrical stabilizer it must have a residual resistivity ratio (RRR) of at least 100. In addition the molybdenum can function as a diffusion barrier. Then the obtained assembly is inserted into a tantalum or niobium tube, which protects the molybdenum barrier from contaminations from the stainless steel can. Such a contamination may reduce the residual resistivity ratio of molybdenum. After insertion into the stainless steel can, which is also sealed under vacuum preferentially by electron beam welding, extrusion and wire drawing is as described in example 1.

Example 4

The manufacturing process is as described in example 3.

The assembly (TMC, molybdenum, tantalum/niobium and stainless steel) is subject of hot isostatic pressing (HIP) before extrusion, which assures perfect bonding between the different constituents. Extrusion and wire drawing is as described in example 1.

The present invention is not limited to the above realizations and can be extended to any type of TMC superconductor wires manufactured according to the process defined in the attached claims.

The invention claimed is:

1. A process for manufacturing a ternary molybdenum chalcogenide (TMC) superconducting wire, the superconducting wire comprising $SnMo_6S_8$, $PbMo_6S_8$, or a mixture thereof, in which an engineering critical current density of the superconducting wire is uniform over a length and is at least 100 A/mm$^2$ at magnetic fields above 22 Tesla, the process comprising:
producing the superconducting wire by powder metallurgy;
compressing a powder comprising $SnMo_6S_8$, $PbMo_6S_8$, or a mixture thereof by hot isostatic pressing (HIP) to form a 100% dense bulk material;
machining the 100% dense material into the shape of a cylinder;
loading the cylinder of 100% dense material into a high purity molybdenum can;
sealing the high purity molybdenum can under vacuum;
loading the cylinder of 100% dense material in the high purity molybdenum can into a stainless steel can suited for applications at the temperature of liquid helium;
sealing the stainless steel can under vacuum;
thereafter preforming hot extrusion between 1200° C. and a limit of the stainless steel; and
performing hot wire drawing between 500° C. and 1200° C. to allow plastic/superplastic deformation of one or more resulting ternary molybdenum chalcogenide filaments.

2. The process according to claim 1, further comprising manufacturing a monofilamentary or a multifilamentary superconducting basic conductor which is hot deformed to a round or a hexagonal cross section;
cutting the superconducting basic conductor into straight pieces;
restacking the superconducting basic conductor under vacuum into a stainless steel extrusion billet; and
submitting the stainless steel extrusion billet to a hot deformation.

3. The process according to claim 2, further comprising, cutting the multifilamentary superconductor into straight pieces following a hot deformation of the stainless steel billet;
restacking the resultant pieces from the hot deformation under vacuum-into a subsequent stainless steel extrusion billet; and
hot deforming the subsequent stainless steel extrusion billet to produce a superconductor wire.

4. The process according to claim 1, wherein sealing the high purity molybdenum can under vacuum utilizes electron beam welding.

5. The process according to claim 1, wherein sealing the stainless steel can under vacuum utilizes electron beam welding.

6. The process according to claim 1, wherein the high purity molybdenum can has a residual resistivity ratio of at least 100.

7. The process according to claim 1, further comprising introducing an additional diffusion barrier of tantalum or niobium, between the stainless steel jacket and the molybdenum barrier, in order to maintain the residual resistivity ratio of the molybdenum during the hot extrusion and the wire drawing process.

8. A process for manufacturing a ternary molybdenum chalcogenide (TMC) superconducting wire, the superconducting wire comprising a bulk material, other than $SnMo_6S_8$, $PbMo_6S_8$, or a mixture thereof, in which an engineering critical current density of the superconducting wire is uniform over a length and is at least 100 A/mm$^2$ at magnetic fields above 22 Tesla, the process comprising:
producing the superconducting wire by powder metallurgy;
compressing a powder, comprising the bulk material other than $SnMo_6S_8$, $PbMo_6S_8$, or a mixture thereof, by hot isostatic pressing (HIP) to form a 100% dense bulk material;
machining the 100% dense material into the shape of a cylinder;
loading the cylinder of 100% dense material into a high purity molybdenum can;
sealing the high purity molybdenum can under vacuum;
loading the cylinder of 100% dense material in the high molybdenum can into a stainless steel can suited for applications at the temperature of liquid helium;
sealing the stainless steel can under vacuum;

thereafter reforming hot extrusion between 1,200° C. and a limit of the stainless steel; and performing hot wire drawing between 500° C. and 1.200° C. to allow plastic/superplastic deformation of one or more resulting ternary molybdenum chalcogenide filaments.

9. The process according to claim 8, wherein the ternary molybdenum chalcogenide powder further comprises additives for improving superconducting properties, in particular, the engineering critical current density and/or the hot deformation process.

10. The process according to claim 9, wherein the additives for improving the hot deformation process do not degrade the residual resistivity ratio (RRR).

11. A ternary molybdenum chalcogenide (TMC) superconducting wire, the superconducting wire comprising $SnMo_6S_8$, $PbMo_6S_8$, or a mixture thereof,
the superconducting wire having an engineering critical current density that is uniform over a length and is at least 100 A/mm$^2$ at magnetic fields above 22 Tesla;
the superconducting wire is manufactured according to the process of claim 1,
wherein the superconducting wire comprises at least one basic element (10) having an internal ternary molybdenum chalcogenide filament (11) surrounded by a molybdenum barrier (12) with a residual resistivity ratio (RRR) of at least 100, further surrounded by a stainless steel jacket (13).

12. The ternary molybdenum chalcogenide (TMC) superconducting wire according to claim 11, further comprises a number of ternary molybdenum chalcogenide monofilament superconductors (10) each having an internal ternary molybdenum chalcogenide filament (11) surrounded by a molybdenum barrier (12) with a residual resistivity ratio (RRR) of at least 100 and further surrounded by a stainless steel jacket (13).

13. The ternary molybdenum chalcogenide (TMC) superconductor element according to claim 12, wherein each of the ternary molybdenum chalcogenide monofilament superconductors (10) is surrounded by either a hexagonal or a round cross section shaped stainless steel jacket (13).

* * * * *